(12) United States Patent
Shen et al.

(10) Patent No.: US 10,944,389 B2
(45) Date of Patent: Mar. 9, 2021

(54) DISPLAY DEVICE HAVING AN INTEGRATED SENSING DEVICE WITH REDUCED INTERFERENCE

(71) Applicant: SYNAPTICS INCORPORATED, San Jose, CA (US)

(72) Inventors: Guozhong Shen, San Jose, CA (US); Petr Shepelev, Campbell, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/444,759

(22) Filed: Jun. 18, 2019

(65) Prior Publication Data

US 2020/0403606 A1 Dec. 24, 2020

(51) Int. Cl.
*H03K 5/156* (2006.01)
*G06F 3/044* (2006.01)
*G09G 3/20* (2006.01)

(52) U.S. Cl.
CPC ........... *H03K 5/1565* (2013.01); *G06F 3/044* (2013.01); *G09G 3/20* (2013.01); *G09G 2310/0264* (2013.01); *H03K 2217/960705* (2013.01)

(58) Field of Classification Search
CPC ..... H03K 5/1565; H03K 2217/960705; G09G 3/20; G09G 2310/0264; G06F 3/044
See application file for complete search history.

(56) References Cited

U.S. PATENT DOCUMENTS

2012/0050217 A1* 3/2012 Noguchi ............... G06F 3/0416
345/174
2018/0107309 A1* 4/2018 Endo ..................... G06F 3/0416

\* cited by examiner

*Primary Examiner* — Mark W Regn
(74) *Attorney, Agent, or Firm* — Leydig, Voit & Mayer, Ltd.

(57) ABSTRACT

A processing system for an input device comprises drive circuitry configured to generate a fixed voltage for a common voltage electrode of the input device during a display update period, and generate a sensing signal for the common voltage electrode during an input sensing period, the sensing signal having a duty cycle and a mean value, wherein the duty cycle minimizes a difference between the fixed voltage and the mean value. An input device comprises one or more common voltage electrodes and a coupled processing system. The processing system is configured to drive the one or more common voltage electrodes with a fixed voltage during a display update period, and a sensing signal during an input sensing period. The sensing signal has a duty cycle and a mean value, the duty cycle configured to minimize a difference between the mean value and the fixed voltage.

20 Claims, 5 Drawing Sheets

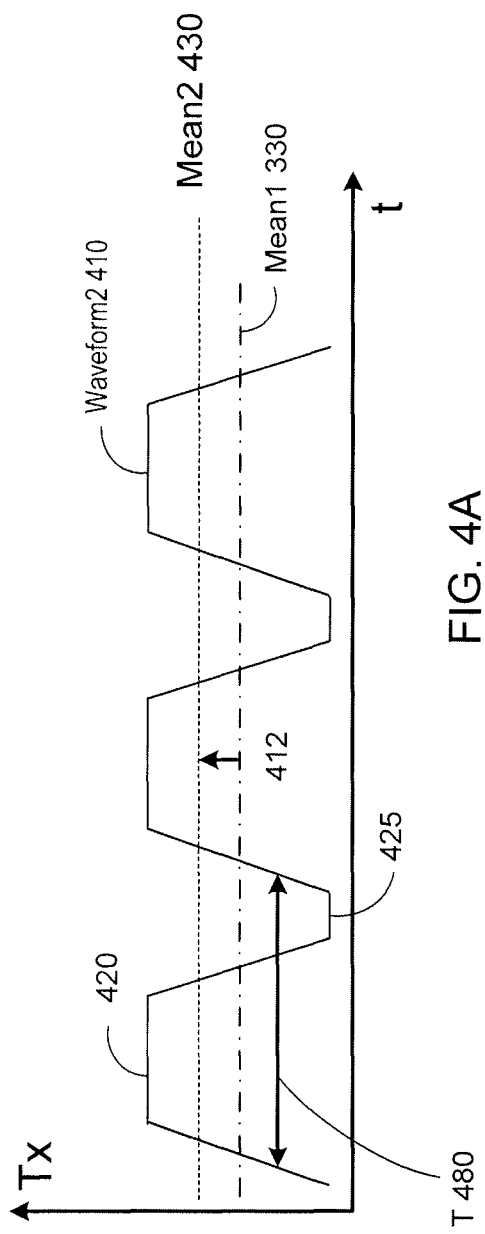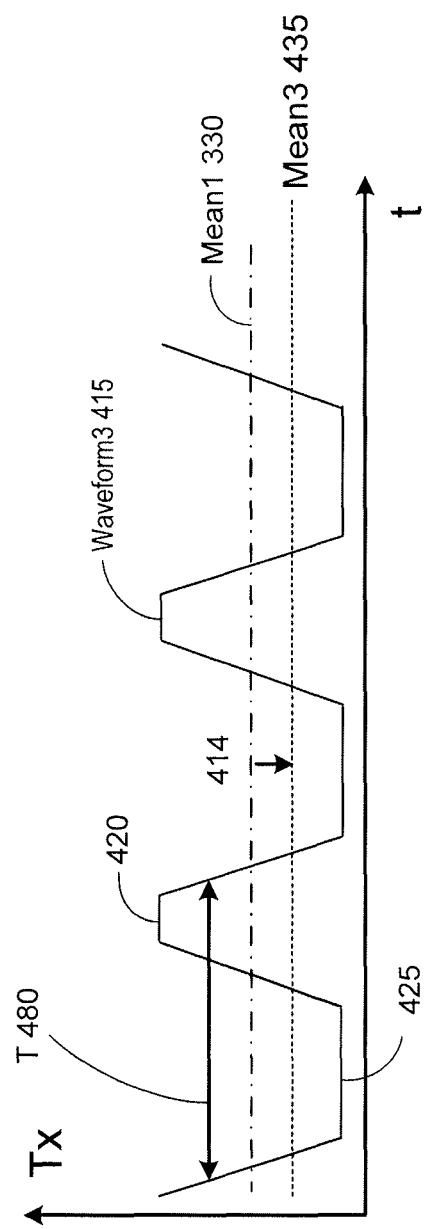

DISPLAY DEVICE HAVING AN INTEGRATED SENSING DEVICE WITH REDUCED INTERFERENCE

TECHNICAL FIELD

Embodiments of disclosure generally relate to electronic devices.

BACKGROUND

Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, proximity sensor devices may be used as input devices for larger computing systems, such as touchpads integrated in, or peripheral to, notebook or desktop computers. Proximity sensor devices may also often be used in smaller computing systems, such as touch screens integrated in cellular phones. Additionally, proximity sensor devices may be implemented as part of a multi-media entertainment system of an automobile.

SUMMARY

In one embodiment, a processing system for an input device comprises drive circuitry configured to generate a fixed voltage to be driven on a common voltage electrode of the input device during a display update period. The drive circuitry may be further configured to generate a sensing signal to be driven on the common voltage electrode during an input sensing period, the sensing signal having a mean value. A duty cycle of the sensing signal may minimize a difference between the fixed voltage and the mean value.

In another embodiment, a method for driving a common voltage electrode of an input device may include driving a common voltage electrode of the input device with a fixed voltage during a display update period, and driving the common voltage electrode with a sensing signal during an input sensing period. The sensing signal may have a duty cycle and a mean value, and the duty cycle may be configured to minimize a difference between the fixed voltage and the mean value, while complying with a minimum settling time of a sensor receiving the sensing signal.

In yet another embodiment, an input device may comprise one or more common voltage electrodes, and a processing system coupled to the one or more common voltage electrodes. The processing system may be configured to drive the one or more common voltage electrodes with a fixed voltage during a display update period, and to drive the one or more common voltage electrodes with a sensing signal during an input sensing period. The sensing signal may have a duty cycle and a mean value, wherein the duty cycle is configured to minimize a difference between the mean value and the fixed voltage, while complying with a minimum settling time of a sensor receiving the sensing signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only some embodiments of this disclosure and are therefore not to be considered limiting of its scope, for the disclosure may admit to other equally effective embodiments.

FIG. 4A illustrates a second example sensing signal with a duty cycle of approximately 70% at the high voltage rail and 30% at the low voltage rail, and a mean voltage closer to the high voltage rail, according to one or more embodiments.

FIG. 4B illustrates a third example sensing signal with a duty cycle of approximately 30% at the high voltage rail and 70% at the low voltage rail, and a mean voltage closer to the low voltage rail, according to one or more embodiments.

Figure 1:
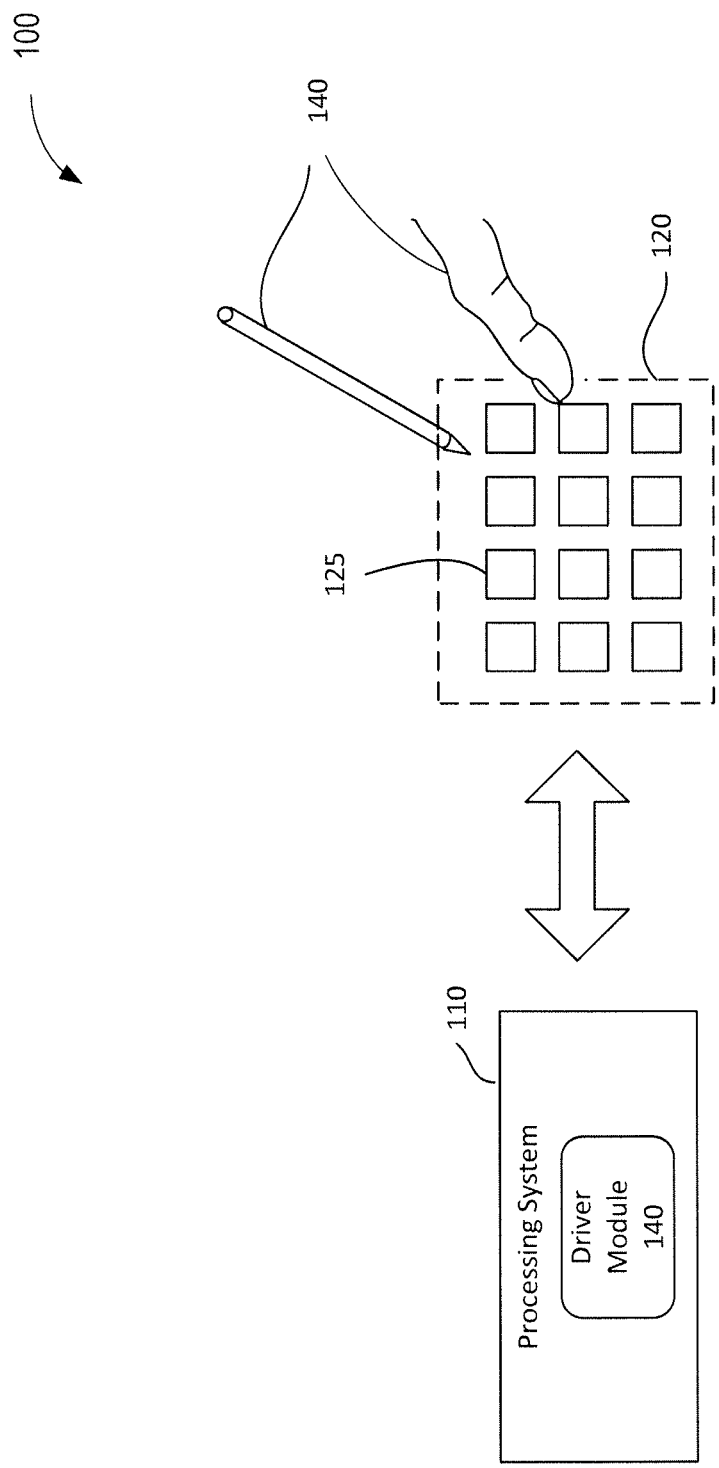
FIG. 1 illustrates an example input device, according to one or more embodiments.

To facilitate understanding, identical reference numerals have been used, where possible, to designate identical elements that are common to the Figures. It is contemplated that elements disclosed in one embodiment may be beneficially utilized on other embodiments without specific recitation. The drawings should not be understood as being drawn to scale unless specifically noted. Also, the drawings may be simplified and details or components omitted for clarity of presentation and explanation. The drawings and discussion serve to explain principles discussed below, where like designations denote like elements.

DETAILED DESCRIPTION

FIG. 1 is a block diagram of an exemplary electronic device 100, in accordance with embodiments of the disclosure. The electronic device 100 may be configured to provide input to an electronic system (not shown), and/or to update one or more devices. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include electronic device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device. In other embodiments, the electronics system may part of an automobile, and the electronic device 100 represents one or more sensing devices of the automobile. In one embodiment, an automobile may include multiple electronic devices 100, where each electronic device 100 may be configured differently than the other.

The electronic device 100 can be implemented as a physical part of the electronic system, or can be physically separate from the electronic system. As appropriate, the electronic device 100 may communicate with parts of the electronic system using any one or more of the following: buses, networks, and other wired or wireless interconnections. Examples include I$^2$C, SPI, PS/2, Universal Serial Bus (USB), Bluetooth, RF, and IRDA.

In one or more embodiments, the electronic device 100 may utilize any combination of sensor components and sensing technologies to detect user input. For example, as illustrated in FIG. 1, the electronic device 100 comprises one or more electrodes 125 that may be driven to detect objects or update one or more devices. In one embodiment, the electrodes 125 are sensor electrodes of a capacitive sensing device. In such embodiments, electrodes 125 include one or more common voltage electrodes. In other embodiments, the electrodes 125 are electrodes of an image sensing device, radar sensing device, and ultrasonic sensing device. Further yet, the electrodes 125 may be display electrodes of a display device. In embodiments where the electrodes 125 of the electronic device 100 are comprised of the common electrodes and have a common shape, the electronic device 100 may be referred to as including an Advanced Matrix Pad (AMP) technology.

Some capacitive implementations utilize "self-capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage, or modulated with reference to the transmitter sensor electrodes to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

Capacitive sensing devices may be used for detecting input objects in proximity to and/or touching input devices. Further, capacitive sensing devices may be used to sense features of a fingerprint.

In FIG. 1, a processing system 110 is shown as part of the electronic device 100. The processing system 110 is configured to operate hardware of the electronic device 100. As illustrated in FIG. 1, processing system 110 comprises a driver module 140, which may include a signal generator. In one or more embodiments, the driver module 140 generates sensing signals with which to drive electrodes 125. In various embodiments, the processing system 110 comprises parts of or all of one or more integrated circuits (ICs) and/or other circuitry components.

In some embodiments, the processing system 110 also comprises electronically-readable instructions, such as firmware code, software code, and/or the like. In some embodiments, components composing the processing system 110 are located together, such as near sensing element(s) of the electronic device 100. In other embodiments, components of processing system 110 are physically separate with one or more components close to sensing element(s) of electronic device 100, and one or more components elsewhere. For example, the electronic device 100 may be a peripheral coupled to a desktop computer, and the processing system 110 may comprise software configured to run on a central processing unit of the desktop computer and one or more ICs (perhaps with associated firmware) separate from the central processing unit. As another example, the electronic device 100 may be physically integrated in a phone, and the processing system 110 may comprise circuits and firmware that are part of a main processor of the phone. Further yet, the processing system 110 may be implemented within an automobile, and the processing system 110 may comprise circuits and firmware that are part of one or more of the electronic control units (ECUs) of the automobile. In some embodiments, the processing system 110 is dedicated to implementing the electronic device 100. In other embodiments, the processing system 110 also performs other functions, such as operating display screens, driving haptic actuators, etc.

The processing system 110 may be implemented as one or more modules that handle different functions of the processing system 110 (e.g., driver module 140). Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes. In some embodiments, processing system 100 may be implemented as a chip, or as one or more chips. In some embodiments, processing system 100 may comprise a controller, or a portion of a controller, of electronic device 100.

In one or more embodiments, a display driver (e.g., driver module 140) may be configured for both display updating and input sensing, and may, for example, be referred to as including touch and display driver integration (TDDI) technology. In such embodiments, driver module 140 may be implemented as a TDDI chip, or a portion of a TDDI chip.

In some embodiments, the processing system 110 responds to user input (or lack of user input) directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions. Further, in some embodiments, the processing system 110 is configured to identify one or more target objects, and the distance to the target objects.

For example, in some embodiments, the processing system 110 operates electrodes 125 to produce electrical signals (resulting signals) indicative of input (or lack of input) in a sensing region. The processing system 110 may perform any appropriate amount of processing on the electrical signals in producing the information provided to the electronic system. For example, the processing system 110 may digitize analog electrical signals obtained from the electrodes 125. As another example, the processing system 110 may perform filtering or other signal conditioning, or, as yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, recognize fingerprint information, distance to a target object, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

It should be understood that while many embodiments of the disclosure are described in the context of a fully functioning apparatus, the mechanisms of the present disclosure are capable of being distributed as a program product (e.g., software) in a variety of forms. For example, the mechanisms of the present disclosure may be implemented and distributed as a software program on information bearing media that are readable by electronic processors (e.g., non-transitory computer-readable and/or recordable/writable information bearing media readable by the processing system 110). Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

In one or more embodiments, the processing system 110 is configured to generate a voltage signal having minimized electrical (EMI) emissions in one or more frequency bands or portions of frequency bands, as compared to other voltage signals. As described in greater detail below, in one embodiment the processing system 100 is configured to generate a voltage signal to drive a common voltage electrode of electrodes 125 during a display update interval and an input sensing interval, respectively. In such embodiment, the voltage signal generated to drive the common voltage electrode during a display update interval is a substantially constant, or fixed voltage, and the voltage signal generated to drive the common voltage electrode during an input sensing interval may be referred to as a sensing signal, having a waveform with a periodically variable voltage. In one embodiment, the waveform has a mean voltage value that is as close as possible (given other constraints) to the fixed voltage of the voltage signal used to drive the common voltage electrode during a display update interval. In one or more embodiments, the value of a voltage signal to drive one or more common voltage electrode of electrodes 125 during a display update interval may be predetermined. For example, the voltage value may be provided by a manufacturer of electronic device 100 and/or the electrodes 125, and may be device-specific to electronic device 100.

In one embodiment, the driver module 140 comprises circuitry configured to provide the capacitive sensing signal. For example, the driver module circuitry may include an oscillator, one or more current conveyers and/or a digital signal generator circuit. In one embodiment, the driver module circuitry generates the voltage signal based on a clock signal, the output of oscillator and the parameters discussed above.

In one or more embodiments, the driver module generates a signal to drive a common voltage (Vcom) electrode of electrodes 125 at a fixed voltage during display update periods, and a sensing signal to drive the Vcom electrode during input sensing update periods. In such embodiments, an input sensing update period is provided in between two display update periods, and is of a shorter duration than a display update period. In such embodiments, there are several display update periods and input sensing update periods per display frame.

Figure 2:
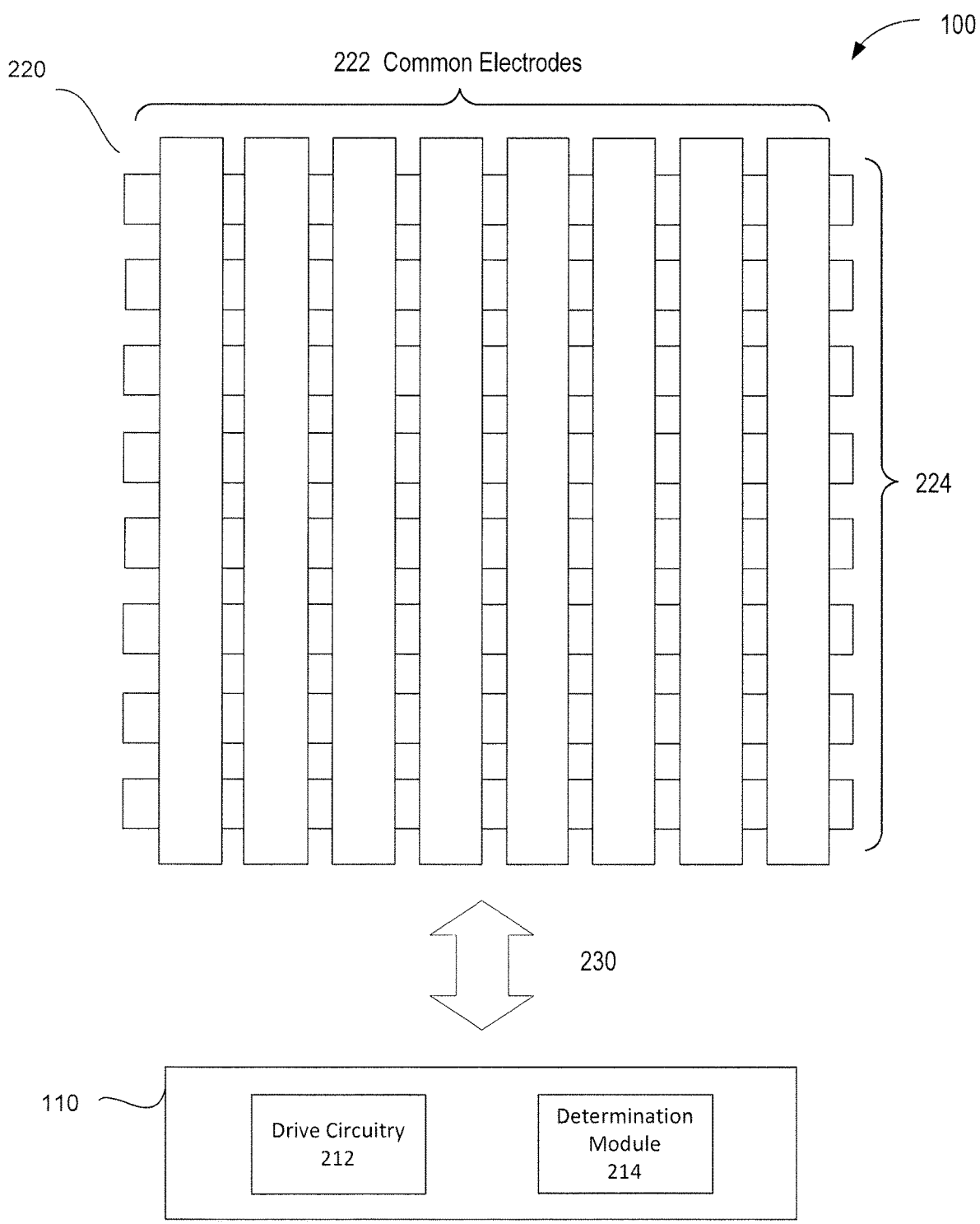
FIG. 2 illustrates an example input device, according to one or more embodiments.

FIG. 2 illustrates an example input device 100, according to one or more embodiments. The input device 100 includes sensor electrodes 220 which are coupled to processing system 110 through traces indicated by wide arrow 230. The sensor electrodes 220 include sensor electrodes 222 and sensor electrodes 224. In one embodiment, the sensor electrodes 222 are disposed on a first layer and the sensor electrodes 224 are disposed on a second layer. For example, the sensor electrodes 222 may be disposed on a first substrate and the sensor electrodes 224 maybe disposed on a second substrate. Further, the sensor electrodes 222 may be disposed on a first side of a first substrate and the sensor electrodes 224 may be disposed on a second side of the first substrate. In one or more embodiments, the sensor electrodes 222 and the sensor electrodes 224 may be disposed on a common side of a substrate. In such embodiments, the sensor electrodes 222 and the sensor electrodes 224 may be non-overlapping or may be overlapping, and one of the sensor electrodes 222 and the sensor electrodes 224 includes jumpers in the overlapping regions that isolate the sensor electrodes 222 from the sensor electrodes 224.

In one or more embodiments, sensor electrodes 222 are common voltage electrodes (so indicated in FIG. 2), which are driven by processing system 110 with an input sensing signal. In such embodiments the processing system 110 is configured to generate a voltage signal to drive one or more common voltage electrodes 222 during a display update interval and during an input sensing interval, respectively. In such an embodiment, the voltage signal generated to be driven on the common voltage electrode during a display update interval is a substantially constant, or fixed voltage, and the voltage signal generated to be driven on the common voltage electrode during an input sensing interval is a sensing signal, having a waveform with a periodically variable voltage. In one embodiment, the waveform has a mean voltage value that is as close as possible (given other constraints) to the fixed voltage of the voltage signal used to drive the common voltage electrode during a display update interval. In one embodiment, the value of a voltage signal driven on the one or more common voltage electrodes 222 during a display update interval may be predetermined. For example, the voltage value may be provided by a manufacturer of the input device 100, or of a display device of the input device 100, and may be device-specific to the input device 100 or to the display device of the input device 100.

The sensor electrodes 220 may have any shape, size and/or orientation. For example, the sensor electrodes 220 may be arranged in a two-dimensional array as illustrated in FIG. 2. Alternatively, the sensor electrodes 220 may be arranged as a matrix of non-overlapping sensor electrodes. Each of the sensor electrodes 220 may be substantially rectangular in shape. In other embodiments, the sensor electrodes 220 may have other shapes. Further, each of the sensor electrodes 220 may have the same shape and/or size. In other embodiments, at least one sensor electrode may have a different shape and/or size than another sensor electrode. In various embodiments, the sensor electrodes 220 may be diamond shaped, have interdigitated fingers to increase field coupling, and/or have floating cut-outs inside to reduce stray capacitance to nearby electrical conductors.

The processing system 110 includes the drive circuitry 212. In one or more embodiments, the drive circuitry 212 generates a voltage signal to drive one or more common voltage electrodes 222 during a display update interval and during an input sensing interval, respectively, as described above. In one or more embodiments, the drive circuitry 212 may include hardware and firmware elements configured to drive the sensor electrodes 220 to acquire sensor data. For example, the drive circuitry 212 may include receiver circuitry configured to receive resulting signals from one or more of the sensor electrodes 220. Additionally, the drive circuitry 212 may include transmitter circuitry configured to drive sensing signals onto one or more of the sensor electrodes 220. The transmitter circuitry may include one or more amplifiers configured to drive sensing signals onto one or more of the sensor electrodes 220. The amplifiers may correspond to one or more buffers or modulators. Further, the receiver circuitry may include analog front ends (AFEs) configured to receive resulting signals from one or more of the sensor electrodes 220. The sensing signals may include transcapacitive sensing signals for transcapacitive sensing and absolute capacitive sensing signals for absolute capacitive sensing. In one embodiment, the drive circuitry 212 is configured to operate the sensor electrodes 220 for absolute capacitive sensing by driving one or more of the sensor electrodes 220 with absolute capacitive sensing signals while receiving resulting signals with the driven sensor electrodes. Further, the drive circuitry 212 may be configured to operate the sensor electrodes 220 for transcapacitive sensing by driving one or more of the sensor electrodes 220 with a transcapacitive sensing signal and receiving resulting signal from another one or more of the sensor electrodes 220. The sensor electrodes 220 driven with the transcapacitive sensing signal may be referred to as a transmitter electrodes and the sensor electrodes 220 operated to receive resulting signals may be referred to as a receiver electrodes.

In one embodiment, the sensing signals may be varying voltage signals that vary between at least two voltages. Further, the sensing signal may include a plurality of sensing bursts. In various embodiments, each sensing bursts may include a plurality of voltage transitions. In one or more embodiments, the drive circuitry 212 may maintain the receiver electrodes at a substantially constant voltage (e.g., relative to system ground) or modulate the receiver electrodes relative to the transmitter electrodes. In one embodiment, when the receiver electrodes are modulated (e.g., relative to system ground), the transmitter electrodes are modulated relative to the receiver electrodes, such that the transmitter electrodes are modulated at a different phase, polarity, amplitude, and/or frequency than the receiver electrodes. In one or more embodiments, the drive circuitry 212 receives resulting signals with the receiver electrodes and the determination module 214 measures the resulting signals to determine a measurement of the change in capacitive coupling between the receiver electrodes and the transmitter electrodes.

The drive circuitry 212 may be configured to drive each of the transmitter electrodes one at a time, or simultaneously drive at least two of the transmitter electrodes. In one embodiment, the drive circuitry 212 is configured to simultaneously drive at least two transmitter electrodes with different transcapacitive sensing signals based on different codes or frequencies. For example, multiple transmitter electrodes may be simultaneously driven with transcapacitive sensing signals which are modulated with substantially orthogonal coded sequences (e.g., amplitude shifted, phase shifted, frequency shifted). The corresponding resulting signals may be decoded to independently determine the change in capacitive coupling between the transmitter electrodes and the receiver electrodes.

In various embodiments, the sensor electrodes 220 are operated for absolute capacitive sensing by the drive circuitry 212. In such an embodiment each of the sensor electrodes 220 may be modulated relative to a reference voltage (e.g., system or device ground) with an absolute capacitive sensing signal by the drive circuitry 212 such that the drive circuitry 212 receives resulting signals from the modulated sensor electrodes.

The processing system 110 further includes the determination module 214. In one or more embodiments, the determination module 214 may be configured to determine changes in a capacitive coupling between each modulated sensor electrode and an input object, such as input object 140 (as shown in FIG. 1), from the resulting signals. In one embodiment, all of sensor electrodes 220 may be simultaneously operated for absolute capacitive sensing, such that a different resulting signal is simultaneously received from each of the sensor electrodes or a common resulting signal from two or sensor senor electrodes. In another embodiment, the sensor electrodes 222 may be operated for absolute capacitive sensing during a first period and the sensor electrodes 224 may be operated for absolute capacitive sensing during a second period that is non-overlapping with the first period.

The areas of localized capacitive sensing of capacitive couplings may be termed "capacitive pixels." The capacitive pixels may be formed between individual sensor electrodes of the sensor electrodes 220 and a reference voltage in embodiments employing absolute capacitive sensing methods and between groups of sensor electrodes 220 used as transmitter and receiver electrodes in embodiments employing transcapacitive sensing methods. For example, in an embodiment employing absolute capacitive sensing, the capacitive pixels may be formed between where parallel fields from the input object 140 couple to system ground of the input device 100. Further, in embodiments employing transcapacitive sensing method, the capacitive pixels may be formed where fringing fields of a first sensor electrode couple to a neighboring sensor electrode most strongly. In various embodiments, a set of measurements between the sensor electrodes 220 or between the sensor electrodes 220 and an input object may be utilized by the determination module 214 to form the capacitive pixels of a "capacitive image" or points along one or more capacitive profiles or projections. In one embodiment, the determination module 214 is configured to determine one or more capacitive images and transcapacitive profiles along the sensor electrodes 222 and 224 based on the measurements of the change in capacitive coupling between the sensor electrodes.

In some touch screen embodiments, one or more of the sensor electrodes 220 comprise one or more display electrodes used in updating the display of the display device. In one or more embodiments, the display electrodes comprise one or more segments of a Vcom electrode, a data line, gate line, an anode electrode, a cathode electrode, or any other display element. In one embodiment, the common electrodes may be disposed on the transparent substrate (a glass substrate, TFT glass, or any other transparent material) in some display screens (e.g., In Plane Switching (IPS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over or above cathode layer (OLED), etc. In one or more embodiments, the electrode or electrodes may be utilized for both capacitive sensing and display updating and may be referred to as "combination electrode", since it performs multiple functions. In various embodiments, the common electrode may be segmented to form a plurality of common electrodes and each of the sensor electrodes 220 comprises one or more common electrodes. In some such embodiments, as noted, the example input device 100 may be referred to as including AMP technology. The sensor electrodes 220 may be operated for capacitive sensing during a capacitive frame. For example, during a capacitive frame the sensor electrodes 220 may be operated for transcapacitive sensing and/or absolute capacitive sensing to determine the positional information of one or more input objects.

In one embodiment, a capacitive frame rate (or sensing rate) corresponds to how often a capacitive frame is completed. For example, a capacitive frame may be acquired once every 16 ms, generating a capacitive frame rate of 60 Hz. In other embodiments, the capacitive frame rate may be about 90 Hz, 120 Hz, 240 Hz, 400 Hz or greater. Further, in one or more embodiments, the capacitive frame rate may be less than 60 Hz (e.g., for low power sensing).

Multiple capacitive frames may be acquired over multiple time periods, and differences between them used to derive information about input in the sensing region. For example, successive capacitive frames acquired over successive periods can be used to track the motion(s) of one or more input objects entering, exiting, and within the sensing region, or alternately report an input object hovering (e.g., proximate to, but not in contact with an input surface of the input device 100), touching (e.g., in contact with an input surface of the input device 100), pressing on the input surface of the input device or lifting from a the input surface of the input device 100 for various GUI implementations.

In one or more embodiments, capacitive sensing (or input sensing) and display updating may occur during at least partially overlapping periods. For example, as a display panel is driven for display updating, the sensor electrodes 220 may also be driven for capacitive sensing. In another embodiment, capacitive sensing and display updating may occur during non-overlapping periods, also referred to as non-display update periods. In one such embodiment, the non-display blanking period may be between the last line of a display frame and the first line of the following display frame (e.g., during a vertical blanking period). In various embodiments, the non-display update periods may occur between display line update periods for two consecutive display lines of a display frame and may be at least as long in time as the display line update period.

In such embodiment, the non-display update period may be referred to as a long horizontal blanking period, long h-blanking period or a distributed blanking period, where the blanking period occurs between two display updating periods within a frame and is at least as long as a display update period. In one embodiment, the non-display update period occurs between display update periods of a frame and is long enough to allow for multiple transitions of the transcapacitive sensing signal to be driven onto the sensor electrodes to be sampled and filtered. In other embodiments, the non-display update period may comprise horizontal blanking periods and vertical blanking periods. Further, the combination of horizontal blanking periods and vertical blanking periods present in the non-display update period or periods may depend on the a selected interference level and selected report rate for the measurement. Further, the types of input sensing performed may be used to determine the combination of horizontal blanking periods and vertical blanking periods present in the non-display update period or periods. For example, hover sensing may be performed between display frames and touch detection may be performed during display frames.

In embodiments that include an integrated display device with input sensing device, such as, for example an implementation of TDDI, or, for example, an implementation of AMP sensing based TDDI, all of the common electrodes, comprising several individual common voltage electrodes 222, are driven by a waveform signal during a capacitive sensing period (also referred to herein as an "input sensing" period). The waveform signal, for example, may run at a frequency between 80 kHz and 400 kHz, which frequency band is significantly above the maximum frequency audible by human ears. However, as noted above, input sensing bursts are broken into multiple pieces between display updates. In such embodiments, the common electrodes are driven at a constant voltage during display update periods. During a transition between display update periods and input sensing periods, if there is a voltage difference between that of the common electrodes and a mean voltage value of an input sensing waveform, then a frequency component of hundreds of Hz may be introduced, which human ears are very sensitive to. Thus, when a user's ear is placed in close proximity to the display panel 120, a capacitor formed between the user's body and the display panel 120 may cause vibration at this frequency, which is manifested as user-audible noise. Because there are several such transitions per minute, the user may perceive the audible noise as a constant buzzing sound, and find it annoying or distracting.

As noted, in one or more embodiments, the value of the fixed voltage used to drive the common electrodes 222 during a display update interval is predetermined, and is a device-specific value of input device 100. In some embodiments the fixed voltage is between, for example, −4V and 0V. In other embodiments it may be between, for example, 0V and +4V. In yet other embodiments, it may include other voltages, or other ranges of voltages. Given such a fixed voltage value, in one or more embodiments user-audible noise is minimized by minimizing the difference in mean voltage of a waveform signal used to drive the common electrodes during an input sensing period. In such embodiments, this is done by setting a duty cycle of the input sensing signal to minimize this voltage difference. In many such embodiments, the duty cycle, so set, is not a 50% duty cycle, such as is shown in the example embodiment of FIG. 3, where the voltage is at the high voltage rail value and at the low voltage rail of display driver circuitry 210 for equal fractions of a period T of the input sensing signal. This is because the mean voltage value for such a 50% duty cycle is one half of the peak to peak voltage of the signal, e.g., one half of the difference between the two voltage rails of the display driver circuitry. If that mean voltage value is different than the constant voltage value used to drive Vcom during display update intervals, in one or more embodiments, the mean voltage value is moved to be as close as possible to that fixed voltage value. To do that, in such embodiments, the duty cycle of the input sensing signal may be set to be other than a 50% duty cycle.

In such embodiments, the duty cycle for the input sensing signal is set for input device 100 at manufacture, following calibration, in response to the constant voltage value, specific to device 100, used during display update intervals. In such embodiments, data specifying the duty cycle may be stored, for example, in a nonvolatile memory (e.g., NVRAM). In operation, drive circuitry 212 reads the duty cycle data in the nonvolatile memory and uses it to generate the input sensing signal during each input sensing interval.

Figure 3:
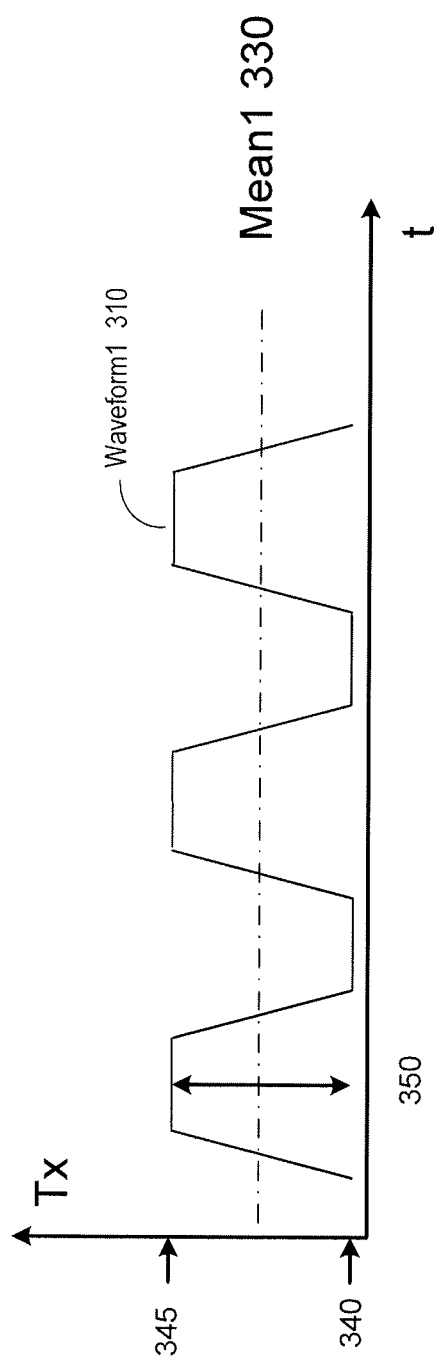
FIG. 3 illustrates an example sensing signal with a duty cycle of approximately 50% at each of the shown high and low voltage rails, and a mean midway between them.

FIG. 3 illustrates an example sensing signal, according to one or more embodiments. The example sensing signal of FIG. 3 has a waveform, "waveform1" 310, with, as noted above, a duty cycle of approximately 50% at each of the high and low voltage rails, and a mean, mean1 330 midway between them. For example, waveform1 may have a peak to peak amplitude 350 of 4V. In one or more embodiments, waveform1 may run between a lower voltage rail 340 of −4.5V and an upper voltage rail 345 of −0.5V. In this example, which is for illustrative purposes only, mean1 330 is −2.5V. In one or more embodiments that have a sensing signal such as waveform1 that runs between these example voltage rails, if the constant voltage used to drive the Vcom layer of a given device during display updates is higher, or lower, than −2.5V, then the mean of the input sensing signal may be changed, to move it closer to the Vcom constant voltage. In one or more embodiments, this may be accomplished by changing the duty cycle of the input sensing signal. Two such example changed duty cycles are illustrated in FIGS. 4A and 4B, respectively, next described.

In accordance with various embodiments, the duty cycle may be changed without changing the amplitude of the input sensing signal. As a result, in such embodiments, the signal to noise ratio (SNR) of the input sensing signal will not change, provided that signal settling is similar for different duty cycles that may be used. Additionally, the supply voltage rail does not need to be expanded, which may, for example add circuit complexity as well as a higher stress voltage on transistors. Thus, in such embodiments, display driver circuitry generates the input sensing signal to have a modified duty cycle, but to also utilize its maximum voltage range.

In each of FIGS. 4A and 4B a different example adjusted duty cycle for a sensing signal is plotted. The two waveforms 410 and 415 have a period T 480, and each has a first segment 420 at the higher voltage rail, and a second segment 425 at the lower voltage rail. FIG. 4A illustrates a first example adjusted waveform, waveform2 410, with a duty cycle of approximately 70% at the high voltage rail and 30% at the lower voltage rail. Thus, first segment 420 as shown is considerably longer than second segment 425. Due to the uneven duty cycle, waveform2 410 has a mean voltage mean2 430 that is closer to the high voltage rail, and higher than mean1 300 of FIG. 3, also plotted in FIG. 4A for ease of comparison. For this particular example of FIG. 4A, given the voltage rails of −4.5V and −0.5V, mean1 of a 50% duty cycle is equal to −2.5V, and mean2 430 is approximately −1.7V. This raising of the mean of the input sensing signal by changing its duty cycle to have a greater duration of each period at the maximum voltage is illustrated by arrow 412.

Similarly, FIG. 4B illustrates a second example adjusted waveform, waveform3 415, with a duty cycle of approximately 30% at the high voltage rail and 70% at the low voltage rail. Thus first segment 420, as shown is considerably shorter than second segment 425. Due to the uneven duty cycle, waveform3 415 has a mean voltage mean3 435 that is closer to the lower voltage rail, and lower than mean1 300 of FIG. 3, also plotted in FIG. 4B for ease of comparison. For this particular example of FIG. 4B, given the voltage rails −4.5V and −0.5V, as described above, mean3 435 is approximately −3.3V. This lowering of the mean of the input sensing signal by changing its duty cycle to have a greater duration of each period at the minimum voltage is illustrated by arrow 414.

As seen in the two examples of FIGS. 4A and 4B, by changing the duty cycle of an input sensing signal, any difference between a mean of the input sensing signal and a fixed voltage used to drive the common electrodes during display update periods may be minimized. However, it is noted that there are some restrictions as to how unevenly a duty cycle may be, given a minimum time needed to acquire a capacitance measurement during a period T of an example input sensing signal. In one or more embodiments, an uneven duty cycle may be chosen so as to move the mean voltage upwards or downwards, as shown respectively in FIGS. 4A and 4B, subject to certain constraints on the length of the smaller segment of the sensing signal. In one or more embodiments, these constraints may include sufficient length in time of the smaller segment to provide enough settling time for a sensor receiving the sensing signal to measure a sufficiently high signal at a signal to noise ratio (SNR) appropriate for the input device's touch performance and filter bandwidth for interference mitigation. Thus, in such embodiments, given an example fixed voltage value, sensing signal frequency and peak to peak amplitude, and sensor settling time requirement at a given desired SNR, the duty cycle of the sensing signal may be modified as appropriate.

For example, for a sensing signal such as that shown in FIG. 4A, where it is desired to raise the mean value to be closer to the upper voltage rail, it is assumed that the transmitted sensing signal Tx is a square wave between −4.5V and −0.5V. It is further assumed, in this example, that the common voltage for a display update interval, VCOM, is −2.0V. The ideal mean of Tx is then −2V, which would result in no voltage difference between the mean value and the common voltage signal, and thus completely obviate audible noise. Using a 50% duty cycle results in a VCOM that is too low, as follows. Using the equation:

$$V\text{mean}=V1*D+V2*(1-D), \text{ where } D \text{ is the duty cycle,}$$
$$t1/T,$$

for a 50% duty cycle D=1−D=½. Thus, Vmean=(−4.5V)*½+(−0.5V)*½=−2.25V−0.25V=−2.5V, which is lower than the ideal mean for this example of Tx of −2.0V. Thus, the mean voltage needs to be raised, as shown in FIG. 4A.

Given these example values, setting Vmean at the ideal mean of −2.0V, the following calculation may be performed:

$$V\text{mean}=-2.0V=V1*D+V2*(1-D)$$

$$-2.0V=(-4.5V)*D+(-0.5V)*(1-D)$$

$$-2.0V=-4.5VD-0.5V+0.5VD$$

$$-1.5V=-4.0VD, \text{ or } D=1.5/4=0.375.$$

Thus, a duty cycle of 37.5% at −4.5V and 62.5% at −0.5V makes the mean of Tx exactly −2V, as follows: (−4.5V)*(0.375)+(−0.5V)*(0.625)=−1.6875V −0.3125V=−2.0V.

In one or more alternate embodiments in which a display device with an integrated input sensing device is disposed in an automobile, adjusting the duty cycle of an input sensing signal may be used to mitigate electro-magnetic (EM) emissions from an LCD at desired frequencies. It is noted that adjusting the duty cycle of a sensing signal from 50% to some other value does not change the energy of the signal, but rather distributes the energy of the sensing signal in a different way. Thus, for example, in a square wave (which has a 50% duty cycle), in the frequency domain, every even harmonic is absent. Because the duty cycle is 50%, or ½, it is every second harmonic that is not present. If the duty cycle is any percentage other than 50%, the result is a rectangle wave. In one or more embodiments, a sensing signal rectangle wave, also called a pulse wave, may have any number of different duty cycles, but like a square wave, its harmonic spectrum in the frequency domain is related to its duty cycle. For example, if a rectangle wave has a duty cycle of 25%, or ¼, in the frequency domain, every fourth harmonic is missing. If the duty cycle is 20%, or ⅕, every fifth harmonic would be missing, and similarly, given a duty cycle of 12.5%, or ⅛, every eighth harmonic would be missing. Using this fact, in one or more embodiments, a sensing signal used in an integrated sensing and display device in an automobile context may be adjusted to have less, or even zero, energy at certain harmonics. These harmonics may be those that lie in frequency bands that a given automobile manufacturer desires to exclude to minimize interference. For example, it may be desired to minimize interference in one or more of the AM radio broadcast band (525 kHz through 1606.5 kHz), the FM broadcast band (87.5 MHz through 108 MHz), or, for example, one or more of the GSM bands, e.g., 700/850/1700/2100 Mhz.

As noted above, a sensing signal duty cycle is generally subject to constraints. In one or more embodiments, an uneven duty cycle for a sensing signal in an automotive context may be chosen so as to minimize signal power at certain frequencies, but at the same time to comply with certain constraints on the time duration of the smaller segment of the sensing signal. In one or more embodiments, these constraints may include a minimum temporal duration of the smaller segment. In such embodiments, the minimum time interval is that needed to provide enough settling time for a sensor receiving the sensing signal to measure a sufficiently high signal at a signal to noise ratio (SNR) appropriate for the input device's touch performance and filter bandwidth for interference mitigation. As a result, neither a 0% duty cycle, nor a 100% duty cycle are useful for sensing. However, at all duty cycle values in between, at which, given an example period of the sensing signal, the smaller segment of the sensing signal does last for the minimum temporal duration, the power of the sensing signal at various frequencies may be measured, and an example duty cycle for the sensing signal chosen to minimize signal power at the undesired frequencies. In this manner, EM emissions at those undesired frequencies of the integrated display device may be minimized or eliminated.

Figure 5:
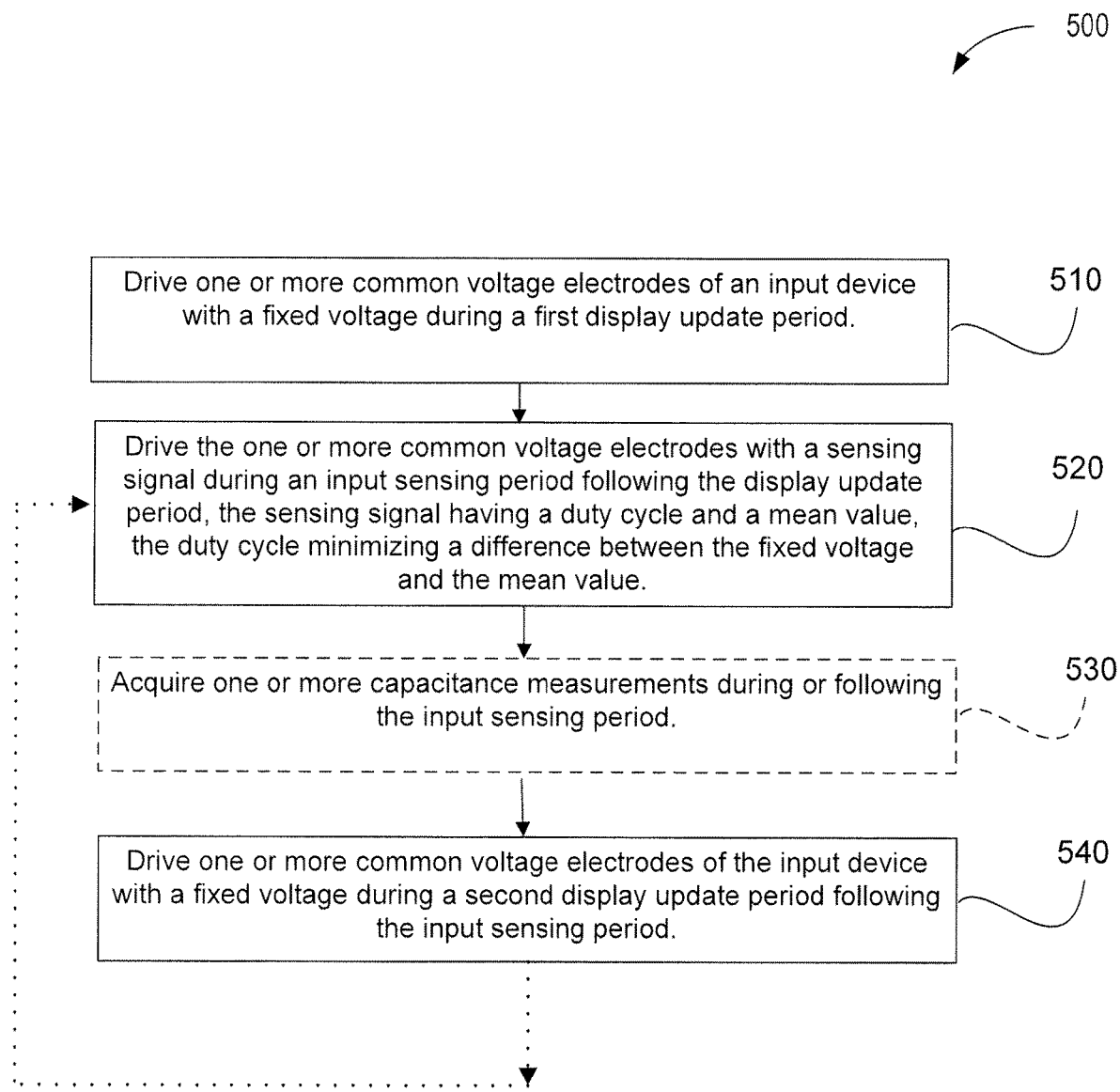
FIG. 5 is a process flow chart illustrating a method for driving one or more common voltage electrodes, according to one or more embodiments.

FIG. 5 is a process flow chart illustrating a method 500 for driving one or more common voltage electrodes, according to one or more embodiments. The method 500 begins at step 510, where one or more common voltage electrodes of a display device are driven with a fixed voltage signal during a first display update period. In one embodiment, display driver circuitry, such as the drive circuitry 212 of the processing system 110 of FIG. 2 generates a fixed voltage with which to drive common electrodes 222 of FIG. 2, and applies that fixed voltage to the electrodes 222. In one embodiment, the fixed voltage is device specific to the input device 100 of FIG. 2. In one example embodiment, the fixed voltage is between −4.0V and 0V. In another example embodiment, the fixed voltage is between 0V and +4V. In yet other embodiments the fixed voltage may be greater, lower, or fall within different ranges.

At step 520, the one or more common voltage electrodes are driven with a sensing signal during an input sensing period following the display update period. The sensing signal has a duty cycle and a mean value, and the duty cycle is configured to minimize a difference between the fixed voltage applied at step 510 and the mean value. In one embodiment, drive circuitry, such as the drive circuitry 212 of the processing system 110 of FIG. 2, generates the sensing signal with which to drive the common electrodes 222 of FIG. 2, and applies that signal to the common electrodes 222 during the input sensing period. In one or more embodiments, the input sensing signal has an unequal duty cycle, such as is illustrated in FIGS. 4A and 4B, so as to set the mean value closer to one of the voltage rails output by the display driver circuitry. In one or more embodiments, for example, the duty cycle of the sensing signal may range from 30%/70% maximum voltage/minimum voltage, to 70%/30% maximum voltage/minimum voltage. In other embodiments, other duty cycles, with other fractions or percentages, may be used.

At step 530, in an optional step from the point of view of signal generation, one or more capacitance measurements are acquired during the input sensing period of step 520. In one embodiment, the drive circuitry 212 drives a first one or more of the sensor electrodes 222, 224 with a sensing signal or signals and receives resulting signals from a second one or more of the sensor electrodes 222, 224. Alternatively, the sensor module 212 drives a first one or more of the sensor electrodes 222, 224 with a sensing signal or signals and receives resulting signals from the driven sensor electrodes 222, 224. The determination module 214 processes the resulting signal or signals to determine one or more capacitance measurements. Further, the determination module 214 determines positional information of the input object 140 from the one or more capacitive measurements. The determination module 214 may output the positional information to a host device. Additionally, or alternatively, the determination module 214 may determine a capacitive image from the capacitive measurements, and determine positional information of the input object 140 from the capacitive image.

From step 530, method 500 proceeds to step 540, where a second display update period begins. In one or more embodiments, at step 540 one or more common voltage electrodes of the display device are driven with a fixed voltage during a second display update period. In one embodiment, the same one or more common voltage electrodes of the display device are driven as were driven in step 510, using the same fixed voltage value. As described above in connection with step 510, in one embodiment, drive circuitry, such as the drive circuitry 212 of the processing system 110 of FIG. 2 generates the fixed voltage with which to drive the common electrodes 222 of FIG. 2 in this second display update period, and applies that fixed voltage to electrodes 222. In one embodiment, the fixed voltage is device specific to the input device 100 of FIG. 2. In one example embodiment, the fixed voltage is between −4.0V and 0V. In another example embodiment, the fixed voltage is between 0V and +4V. At step 540 a loop of the method completes. However, as shown, from the step 540 the method returns to the step 520 and enters a second input sensing period. In embodiments, the method 500 of FIG. 5 operates continually, as long as an example input device, such as the input device 100, is on.

Thus, in one or more embodiments, a processing system of an input device may be configured to generate a sensing signal during an input sensing period. The sensing signal may have a mean voltage value that is close to a common voltage that is generated by the processing system during a display update period. The common voltage may be a substantially constant voltage, or, for example, it may be a fixed, voltage. Further, the common voltage may be a value specific to the input device, determined at manufacture. The sensing signal may be a waveform voltage signal. Further, the sensing signal may be referred to as a guarding waveform voltage signal. The voltage waveform signal may have a duty cycle weighted more heavily towards one of the voltage rails than the other, which may result in its having a mean value that is either greater than, or less than, a mean for a corresponding 50% duty cycle waveform. In one or more embodiments, the input sensing voltage waveform may have a duty cycle of period T, with a larger fraction of T at a maximum voltage and a smaller fraction of T at a lower minimum voltage. In such embodiments, these relative fractions may adjust the mean of the voltage waveform upwards relative to a 50% duty cycle. In other embodiments, the generated voltage waveform may have a duty cycle with a larger fraction of T at the lower minimum voltage, and a smaller fraction of T at the higher maximum voltage. In such embodiments, these relative fractions may adjust the mean of the voltage waveform downwards relative to a 50% duty cycle. In one or more embodiments, by using a duty cycle weighted more heavily to one of the voltage rails, the difference between the mean voltage value of the sensing signal, and the fixed voltage value used for the display update period is minimized. In one or more embodiments, the duty cycle is configured to minimize a difference between the fixed voltage and the mean value, while complying with a minimum settling time of a sensor receiving the sensing signal.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. A processing system for an input device, the processing system comprising:
   drive circuitry configured to:
      generate a fixed voltage to be driven on a common voltage electrode of the input device during a display update period; and
      generate a sensing signal to be driven on the common voltage electrode during an input sensing period, the sensing signal having a mean value and a duty cycle, and having a high voltage value during first portions of the sensing period, and a low voltage value during second portions of the sensing period, the duty cycle specifying relative temporal lengths of the first and second portions,
   wherein the duty cycle is configured to minimize a difference between the fixed voltage and the mean value.

2. The processing system of claim 1, wherein the drive circuitry is further configured to drive the common voltage electrode of the input device with the fixed voltage during the display update period.

3. The processing system of claim 1, wherein the drive circuitry is further configured to drive the common voltage electrode of the input device with the sensing signal during the input sensing period.

4. The processing system of claim 1, wherein a value of the fixed voltage is a device-specific parameter of the input device.

5. The processing system of claim 4, wherein the mean value of the sensing signal is set in response to the value of the fixed voltage.

6. The processing system of claim 1, wherein the sensing signal has a period T, and wherein an amplitude of the sensing signal includes a first segment with a duration of a first fraction of T at a maximum voltage of the drive circuitry, and a second segment with a duration of a second fraction of T at a minimum voltage of the drive circuitry.

7. The processing system of claim 6, wherein the first fraction is greater than the second fraction when the mean value is greater than one half of a difference between a maximum voltage and a minimum voltage of the sensing signal.

8. The processing system of claim 6, wherein the second fraction is greater than the first fraction when the mean value is less than one half of a difference between a maximum voltage and a minimum voltage of the sensing signal.

9. The processing system of claim 6, wherein the duration of each of the first fraction and the second fraction is greater than or equal to a minimum required time for a sensor receiving the sensing signal to acquire a capacitance measurement at a pre-defined signal to noise ratio (SNR).

10. The processing system of claim 1, wherein the input sensing period is provided between two display update periods of a display frame, and wherein there are a plurality of display update periods and corresponding input sensing periods per display frame.

11. A method for driving a common voltage electrode of an input device, the method comprising:
   driving the common voltage electrode of the input device with a fixed voltage during a display update period; and
   driving the common voltage electrode with a sensing signal during an input sensing period, the sensing signal having a duty cycle and a mean value, and having a high voltage value for first portions of the sensing period, and a low voltage value for second portions of the sensing period, the duty cycle specifying relative temporal lengths of the first and second portions, wherein the duty cycle is configured to minimize a difference between the fixed voltage and the mean value, while complying with a minimum settling time of a sensor receiving the sensing signal.

12. The method of claim 11, wherein a value of the fixed voltage is a device-specific parameter of the input device, and wherein the sensing signal is a waveform with a period T.

13. The method of claim 12, wherein an amplitude of the waveform includes a first segment, with a duration equal to a first fraction of T, at a maximum voltage, and a second segment, with a duration equal to a second fraction of T, at a minimum voltage.

14. The method of claim 13, wherein the first fraction is greater than the second fraction when the mean value is greater than one half of the difference between the maximum voltage and the minimum voltage.

15. The method of claim 13, wherein the second fraction is greater than the first fraction when the mean value is less than one half of the difference between the maximum voltage and the minimum voltage.

16. The method of claim 13, wherein the duration of each of the first fraction and the second fraction is greater than or equal to a minimum required time for a sensor receiving the sensing signal to acquire a capacitance measurement at a pre-defined SNR.

17. An input device, comprising:
one or more common voltage electrodes; and
a processing system coupled to the one or more common voltage electrodes configured to:
  drive the one or more common voltage electrodes with a fixed voltage during a display update period; and
  drive the one or more common voltage electrodes with a sensing signal during an input sensing period, the sensing signal having a mean value and a duty cycle, and having a high voltage value for first portions of the sensing period, and a low voltage value for second portions of the sensing period, the duty cycle specifying relative temporal lengths of the first and second portions,
  wherein the duty cycle is configured to minimize a difference between the mean value and the fixed voltage, while complying with a minimum settling time of a sensor receiving the sensing signal.

18. The input device of claim 17, wherein the sensing signal has a period T, and wherein an amplitude of the sensing signal includes a first segment with a duration of a first fraction of T at a maximum voltage, and a second segment with a duration of a second fraction of T at a minimum voltage.

19. The input device of claim 18, wherein:
the first fraction is greater than the second fraction when the mean value is greater than one half of the difference between the maximum voltage and the minimum voltage of the sensing signal; and
the second fraction is greater than the first fraction when the mean value is less than one half of the difference between the maximum voltage and the minimum voltage of the sensing signal.

20. The input device of claim 18, wherein the duration of each of the first fraction and the second fraction is greater than or equal to a minimum required time for a sensor receiving the sensing signal to acquire a capacitance measurement at a pre-defined SNR.

* * * * *